US006366176B1

(12) United States Patent
Peltola

(10) Patent No.: US 6,366,176 B1
(45) Date of Patent: Apr. 2, 2002

(54) METHOD AND ARRANGEMENT FOR GENERATING A CONTROL SIGNAL

(75) Inventor: Seppo Peltola, Kontio (FI)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/939,637

(22) Filed: Aug. 28, 2001

Related U.S. Application Data

(63) Continuation of application No. PCT/FI00/00200, filed on Mar. 14, 2000.

(30) Foreign Application Priority Data

Mar. 15, 1999 (FI) .................................................. 990571

(51) Int. Cl.[7] .............................. H03B 5/04; H03M 1/66
(52) U.S. Cl. ......................... 331/175; 331/17; 331/179; 341/118; 341/144
(58) Field of Search ........................... 331/15, 17, 175, 331/177 R, 179; 327/156–159; 360/51; 455/260; 375/376; 341/118–121, 144

(56) References Cited

U.S. PATENT DOCUMENTS 5,072,358 A  12/1991  Lankford
5,293,166 A * 3/1994 Ta .............................. 341/118
5,477,194 A  12/1995  Nagakura
5,977,839 A  11/1999  Tsumura

FOREIGN PATENT DOCUMENTS

| EP | 412 491 | 2/1991 |
| EP | 735 693 | 10/1996 |
| EP | 909 036 | 4/1999 |

* cited by examiner

Primary Examiner—David Mis
(74) Attorney, Agent, or Firm—Pillsbury Winthrop LLP

(57) ABSTRACT

The invention relates to a method of generating a control signal and to an arrangement comprising a D/A converter for receiving a digital signal and converting the received signal into an analog control signal. The arrangement comprises measuring means for measuring the operating voltage of the D/A converter, means for generating a difference signal from the measurement result obtained from the measurement of the operating voltage, and the nominal value of the operating voltage, whereby the difference signal is used to change the control signal when the operating voltage differs from a nominal value preset for the operating voltage of the D/A converter.

17 Claims, 1 Drawing Sheet

METHOD AND ARRANGEMENT FOR GENERATING A CONTROL SIGNAL

This application is a Continuation of International Application PCT/FI00/00200 filed on the Mar. 14, 2000 which designated the U.S. and was published under PCT Article 21(2) in English.

FIELD

The invention relates to a method of generating a control signal, in which method the control signal is generated from a digital signal which is converted into an analog control signal in a D/A converter.

BACKGROUND

In a prior art arrangement, the control signal of a means controlled by an analog control signal is typically generated by converting the digital signal into an analog control signal. Should the means be for example a voltage-controlled oscillator, the oscillator is controlled by an analog signal generated in a commercially available D/A converter. The D/A converter is coupled to a specific voltage reference, whereby the control voltage of the voltage-controlled means is rendered independent of variations in the operating voltage of the arrangement.

However, the prior art arrangement cannot be integrated as such into a digital ASIC circuit, for example. If the above arrangement is integrated into an ASIC circuit, the operating voltage of the D/A converter could change under the influence of e.g. the load on the arrangement and the temperature. If the operating voltage of a D/A converter changes, the change may also cause a change in the magnitude of the control signal, and consequently the arrangement would not operate in the desired manner. In practice this means that the voltage-controlled oscillator does not provide the desired frequency, but the actual frequency differs from the desired frequency to some degree.

It is therefore an object of the invention to provide a method and an apparatus implementing the method so as to solve the above problems. This is achieved by a method of the type described in the introduction and characterized by measuring the operating voltage of the D/A converter, and, when the operating voltage differs from a nominal value preset for the operating voltage of the D/A converter, changing the control signal on the basis of the measurement result obtained from the measurement of the operating voltage of the D/A converter.

The invention also relates to an arrangement comprising a D/A converter for receiving a digital signal and converting the received signal into an analog control signal.

The arrangement of the invention is characterized by comprising a measuring means for measuring the operating voltage of the D/A converter, a means for generating a difference signal from the measurement result obtained from the measurement of the operating voltage, and the nominal value of the operating voltage, the difference signal being used to change the control signal when the operating voltage differs from a nominal value preset for the operating voltage of the D/A converter.

The preferred embodiments of the invention are disclosed in the dependent claims.

The invention is based on taking into account the operating voltage of the D/A converter in the generation of the control signal, whereby a deviation of the operating voltage from the nominal value does not affect the control signal to be generated.

The method and arrangement of the invention provide a plurality of advantages. The arrangement takes into account variations in the operating voltage during generation of the control signal, whereby the control signal is always optimal in size. A control signal thus generated ensures that the means to be controlled operates in the desired manner. The method of the invention is particularly efficient in compensating for slow variations in the operating voltage.

BRIEF DESCRIPTION OF THE DRAWINGS

In the following, the invention will be described in greater detail in connection with preferred embodiments with reference to the attached drawings, in which.

DESCRIPTION OF EMBODIMENTS

Figure 1:
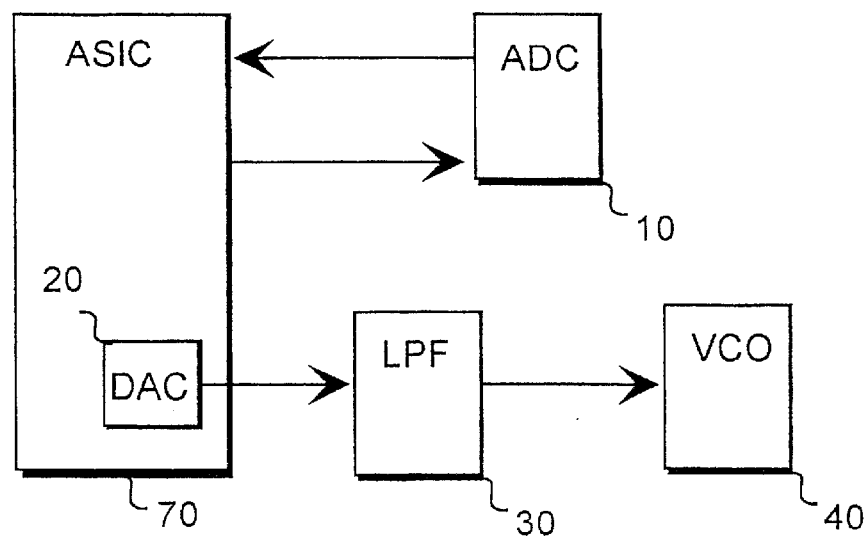
FIG. 1 shows the arrangement of the invention.

Referring to FIG. 1, the arrangement comprises a measuring means 10, a D/A converter 20, a filter 30 and a means 40 to be controlled by a control signal. The means 40 to be controlled by the control signal may be for example a voltage-controlled oscillator. In some cases the means 40 may be controlled by current control. The figure shows that the D/A converter is disposed inside an ASIC circuit 70. However, as to the functionality of the invention, the D/A converter 20 does not have to be disposed in an ASIC circuit. The D/A converter 20 can be implemented by e.g. a pulse width modulator.

Figure 2:
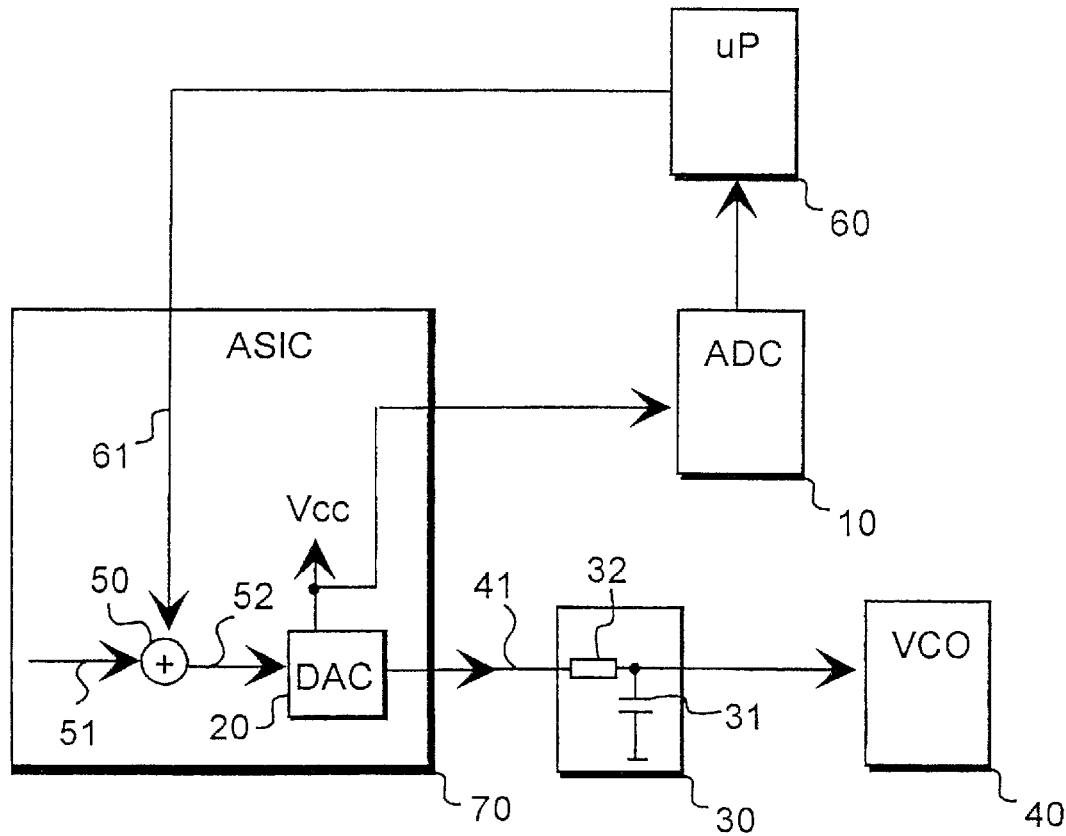
FIG. 2 is a more detailed view of the arrangement of the invention.

FIG. 2 is a more detailed view of the arrangement of the invention. FIG. 2 shows that the input side of the measuring means 10 is coupled to the D/A converter 20. The figure shows that the output side of the measuring means is also coupled to the D/A converter. In practice, the measuring means 10 is coupled to measure the operating voltage (Vcc) of the D/A converter, the nominal magnitude of which may be +5V, for example. In case the operating voltage of the D/A converter is not regulated, the operating voltage changes more easily from its predetermined nominal value, owing to variations in the load, for example.

The measuring means 10 may be implemented for example by an A/D converter which takes samples intermittently from the operating voltage of the D/A converter. The D/A converter and the ASIC circuit may be coupled to the same operating voltage. The output side of the D/A converter 20 is coupled via the filter 30 to the means 40.

Referring to FIG. 2, the arrangement also comprises an adder means 50 and a means 60 which in practice may be a microprocessor, for example. The input side of the adder means 50 is coupled to the means 60 and its output side to the D/A converter 20. The output side of the measuring means is coupled to the means 60.

The arrangement operates as follows. The measuring means 10 is arranged to measure the operating voltage of the D/A converter 20. The measuring means 10 may measure, not only the operating voltage of the D/A converter, but also that of other units in the arrangement. The measuring means may take for example analog samples from the operating voltage, which are converted into a digital signal in the measuring means. The measuring means 10 transmits the digital sample signals further to the means 60 which generates the actual measurement result from the sample signals.

The means 60 generates a difference signal 61 using the voltage value obtained from the measurement, and the nominal value of the operating voltage. The means 60 generates the difference signal 61 for example by subtracting the nominal value of the operating voltage from the measurement result it generated. The difference signal may also be generated for example by subtracting the obtained measurement result from the nominal value of the operating voltage. If the voltage value measured is for example 5.1 V and the nominal value of the operating voltage 5.0 V, the difference signal is generated from a word corresponding to the voltage 0.1 V. Accordingly, the difference signal is used to change the control signal 41 in a direction which maintains as accurately as possible the frequency of the means to be controlled, such as an oscillator, at the value set. In the arrangement, a change in the operating voltage is compensated for in such a manner that the output voltage of the converter 20 is restored to the level on which it was before the change.

The adder means 50 receives a digital signal 51, which is used to generate the analog signal required in controlling the means 40. In practice, the signal 51 is a digital word whose length affects the accuracy of the control signal. A long word gives a more accurate control signal to the means 40 than a short word. The difference signal is also applied to the adder means which adds the difference signal 61 to the signal 51, generating a sum signal 52.

In the converter 20, the sum signal generated by the adder means is converted into an analog signal which is applied to the filter 30 acting as a low-pass filter. FIG. 2 shows that at its simplest, the filter 30 is composed of a capacitor 31 and a resistor 32. After the filtering, the sum signal serves as a control signal for the means 40. If the means 40 is for example a voltage-controlled oscillator, the frequency of the oscillator will change as the magnitude of the control signal changes. The frequency of the oscillator will change for example when the voltage level of the control signal 41 changes.

Adding the difference signal 61 generated by the means 60 to the digital signal 51 decreases or increases the signal 52 conveyed to the D/A converter. When the actual operating voltage of the D/A converter 20 is less than the nominal value of the operating voltage of the D/A converter, then adding the difference signal 61 to the signal 51 increases the voltage of the control signal conveyed to the means 40. In contrast, when the actual operating voltage of the D/A converter 20 exceeds the nominal value of the operating voltage of the D/A converter, then adding the difference signal 61 to the signal 51 decreases the voltage of the control signal conveyed to the means 40. The difference signal can be negative when added to the signal 51 in the adder means. The adder means may also act as a subtractor, subtracting the difference signal from for example the signal 51. The method disclosed may be used to prevent variations in the operating voltage from causing interference to the control signal.

Although the invention was described above with reference to the example in the attached drawings, it is obvious that the invention is not restricted thereto, but may be modified in many ways within the scope of the inventive idea disclosed in the attached claims.

What is claimed is:

1. A method of generating a control signal, comprising:
    generating the control signal from a digital signal which is converted into an analog control signal in a D/A converter;
    measuring the operating voltage of the D/A converter; and
    when the operating voltage differs from a nominal value preset for the operating voltage of the D/A converter, changing the control signal on the basis of the measurement result obtained from the measurement of the operating voltage of the D/A converter.

2. A method as claimed in claim 1, wherein when the operating voltage differs from its nominal value, the contents of the digital signal conveyed to the D/A converter are changed on the basis of the measurement result.

3. A method as claimed in claim 1, further comprising:
    adding to the digital signal a digital signal corresponding to the magnitude of the difference.

4. A method as claimed in claim 1, further comprising:
    sampling the operating voltage intermittently, the samples being used to determine the magnitude of the operating voltage.

5. A method as claimed in claim 1, further comprising:
    increasing the voltage level of the control signal when the operating voltage of the D/A converter is less than the nominal value of the operating voltage.

6. A method as claimed in claim 1, further comprising:
    decreasing the voltage level of the control signal when the operating voltage of the D/A converter exceeds the nominal value of the operating voltage.

7. A method as claimed in claim 1, further comprising:
    controlling a voltage-controlled oscillator by the control signal.

8. An arrangement comprising:
    a D/A converter for receiving a digital signal and converting the received signal into an analog control signal;
    measuring means for measuring the operating voltage of the D/A converter;
    means for generating a difference signal from the measurement result obtained from the measurement of the operating voltage, and the nominal value of the operating voltage, the difference signal being used to change the control signal when the operating voltage differs from a nominal value preset for the operating voltage of the D/A converter.

9. An arrangement as claimed in claim 8, further comprising adder means for adding the difference signal to the digital signal to generate a sum signal from which the control signal is generated.

10. An arrangement as claimed in claim 8, wherein a change in the digital signal conveyed to the D/A converter changes the magnitude of the control signal.

11. An arrangement as claimed in claim 8, further comprising adder means for receiving the difference signal and adding the difference signal to the digital signal as a sum signal, whereby the addition decreases the level of the control signal generated from the sum signal.

12. An arrangement as claimed in claim 8, further comprising adder means for receiving the difference signal and adding the difference signal to the digital signal as a sum signal, whereby the addition increases the level of the control signal generated from the sum signal.

13. An arrangement as claimed in claim 8, wherein the measuring means takes samples intermittently from the operating voltage and the samples are applied to the means which determines from the samples the level of he operating voltage of the D/A converter.

14. An arrangement as claimed in claim 8, wherein the measuring means is implemented by an A/D converter.

15. An arrangement as claimed in claim 8, further comprising adder means for generating a sum signal by adding said digital signal to the difference signal, whereby the addition of the difference signal to the sum signal increases the voltage of the control signal when the operating voltage of the D/A converter is less than the nominal value of the operating voltage.

16. An arrangement as claimed in claim 8, further comprising adder means for generating a sum signal by adding said digital signal to the difference signal, whereby the addition of the difference signal to the sum signal decreases the voltage of the control signal when the operating voltage of the D/A converter exceeds the nominal value of the operating voltage.

17. An arrangement as claimed in claim 8, further comprising a voltage-controlled oscillator controlled by said control signal.

\* \* \* \* \*